(12) United States Patent
Tong et al.

(10) Patent No.: US 6,989,979 B1
(45) Date of Patent: Jan. 24, 2006

(54) ACTIVE ESD SHUNT WITH TRANSISTOR FEEDBACK TO REDUCE LATCH-UP SUSCEPTIBILITY

(75) Inventors: Paul C. F. Tong, San Jose, CA (US); Wensong Chen, San Jose, CA (US); Ping Ping Xu, San Jose, CA (US); Zhiqing Liu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 235 days.

(21) Appl. No.: 10/605,321

(22) Filed: Sep. 22, 2003

(51) Int. Cl.
*H02H 3/20* (2006.01)
*H02H 9/04* (2006.01)

(52) U.S. Cl. .................. 361/91.1; 361/111; 361/56
(58) Field of Classification Search ............ 361/56, 361/111, 91.1; 257/173
See application file for complete search history.

(56) References Cited

U.S. PATENT DOCUMENTS

| | | | | |
|---|---|---|---|---|
| 5,255,146 A | 10/1993 | Miller | | 361/56 |
| 5,559,659 A | 9/1996 | Strauss | | 361/56 |
| 5,744,842 A | 4/1998 | Ker | | 257/362 |
| 5,745,323 A | 4/1998 | English et al. | | 361/56 |
| 5,946,177 A | 8/1999 | Miller et al. | | 361/56 |
| 6,118,640 A | 9/2000 | Kwong | | 361/56 |
| 6,242,942 B1 | 6/2001 | Shamarao | | 326/27 |
| 6,522,511 B1 | 2/2003 | John et al. | | 361/56 |
| 6,552,583 B1 | 4/2003 | Kwong | | 327/112 |
| 6,552,886 B1 | 4/2003 | Wu et al. | | 361/56 |
| 2003/0201457 A1 * | 10/2003 | Lin et al. | | 257/173 |
| 2004/0136126 A1 * | 7/2004 | Smith | | 361/56 |

* cited by examiner

*Primary Examiner*—Phuong T. Vu
*Assistant Examiner*—Dharti H. Patel
(74) *Attorney, Agent, or Firm*—Stuart T. Auvinen

(57) ABSTRACT

A VDD-to-VSS clamp shunts current from a power node to a ground node within an integrated circuit chip when an electro-static-discharges (ESD) event occurs. A resistor and capacitor in series between power and ground generates a low voltage on a trigger node between the resistor and capacitor when an ESD event occurs. A p-channel transistor with its gate driven by the trigger node turns on, driving a gate node high. The gate node is the gate of an n-channel shunt transistor that shunts ESD current from power to ground. A p-channel feedback transistor terminates the ESD shunt current. The p-channel feedback transistor is connected between power and the trigger node, in parallel with the resistor, and has the gate node as its gate. When a latch up trigger occurs, such as electron injection, voltage drops across an N-well of the resistor is prevented by the parallel p-channel feed-back transistor.

17 Claims, 4 Drawing Sheets

ACTIVE ESD SHUNT WITH TRANSISTOR FEEDBACK TO REDUCE LATCH-UP SUSCEPTIBILITY

BACKGROUND OF INVENTION

This invention relates to electro-static-discharges (ESD) protection circuits, and more particularly to reducing latch-up susceptibility of ESD-protection structures.

Small electronic devices such as integrated circuits (IC) are prone to damage and failure from electro-static-discharges (ESD). Various ESD-protection structures have been placed near input, output, or bi-directional I/O pins of ICs. Many of these protection structures use passive components such as series resistors and thick-oxide transistors.

Another type of ESD structure uses an active transistor to safely shunt ESD current. Such an active ESD structure is especially useful for power-to-ground ESD zaps, where the ESD pulse is applied between a power pin and a ground pin. One or more special VDD-to-VSS ESD clamps can be added to the IC. These VDD-to-VSS clamps can turn on when an ESD pulse is applied between the power and ground pins. Sometimes charge from a pin-to-ground, pin-to-VDD, or pin-to-pin ESD zap may charge the internal power or ground buses. The active VDD-to-VSS clamp can turn on to discharge such charge build up, preventing damage deep inside the IC chip.

FIG. 1 shows a prior-art active ESD-protection circuit. Power node 62 is connected to a power supply pin such as VDD. Ground bus 60 is connected to a ground pad. During normal powered operation, the top plate of capacitor 30 is charged to VDD through resistor 20 from power node 62. The high voltage on node 63, the gates of transistors 10, 40 turns on n-channel transistor 40 and turns off p-channel transistor 10, causing the gate of n-channel shunt transistor 50 to be driven low. This keeps n-channel shunt transistor 50 turned off, allowing power node 62 to remain at VDD to power internal circuits.

When an ESD zap or pulse is applied to power node 62, or is somehow coupled into power node 62, such as through a common-discharge line (CDL), the rapid rise in voltage on node 62 causes the source of p-channel transistor 10 to rise quickly. The gate of p-channel transistor 10 does not rise as quickly because of the R-C time constant delay caused by charging of capacitor 30 through resistor 20. The gate-to-source voltage across p-channel transistor 10 increases in absolute value, causing p-channel transistor 10 to turn on. P-channel transistor 10 then charges the gate of n-channel shunt transistor 50 by connecting it to power node 62. The high voltage applied to the gate of n-channel shunt transistor 50 turns it on so that n-channel shunt transistor 50 shunts the ESD current from power node 62 to ground bus 60.

As current slowly flows through resistor 20 to charge the top plate of capacitor 30, the voltage on the gates of transistors 10, 40 rises. Eventually p-channel transistor 10 turns off and n-channel transistor 40 turns on, discharging the gate of n-channel shunt transistor 50 and turning it off. Also, as n-channel shunt transistor 50 discharges power node 62, eventually the magnitude of the gate-to-source voltage of p-channel transistor 10 falls below threshold, turning p-channel transistor 10 off.

While such an active VDD-to-VSS clamp is useful, a secondary problem can occur with the clamp circuit. Latch-up can be caused by the clamp circuit. FIG. 2 is a cross-section diagram of the VDD-to-VSS clamp circuit of FIG. 1. Metal lines in layers above the silicon substrate form most of ground bus 60 and power node 62. The VDD-to-VSS clamp is connected between these two nodes. The VDD-to-VSS clamp includes n-channel shunt transistor 50, n-channel transistor 40, p-channel transistor 10, capacitor 30, and resistor 20. I/O pad 70 is an un-related input/output pad connected to N+ region 66 in p-substrate 64.

N-channel shunt transistor 50 is formed by a gate over the channel between n+ regions 56, 54 in p-substrate 64. Power node 62 connects to drain n+ region 56 while ground bus 60 connects to source n+ region 54 and to p+ tap 52. N-channel transistor 40 is also formed by a gate connected to trigger node 63 over the channel between n+ regions 44, 46. Source n+ region 44 connects to ground, as does p+ tap 42, while drain n+ region 46 connects to the gate of n-channel shunt transistor 50.

P-channel transistor 10 is formed in N-well 12. N+ tap 14 and source p+ region 16 connect to power node 62, while p+ drain region 18 connects to the gate of n-channel shunt transistor 50. Resistor 20 is formed in another N-well 22, between n+ taps 24, 26. The relatively high resistance of the N-well produces the resistor's resistance. A serpentine pattern may be used to increase the length and decrease the width of N-well 22, increasing the total resistance.

Capacitor 30 is formed by the gate oxide between the gate connected to trigger node 63 and the N+ regions 34, 36 in p-substrate 64, which are connected to ground bus 60. P+ tap 32 is also connected to ground bus 60.

A latch-up problem can occur with this VDD-to-VSS clamp circuit. FIG. 3 highlights a potential latch-up trigger in the VDD-to-VSS clamp circuit. When a negative voltage below the ground voltage of ground bus 60 is applied to I/O pad 70, n+ region 66 can become forward biased. Electrons are injected from n+ region 66 into p-substrate 64. These injected electrons will be collected by N-well 22 of resistor 20, or by N-well 12 of p-channel transistor 10.

Electrons collected by N-well 22 may cause a voltage drop along resistor 20, especially when resistor 20 has a larger resistance value when a smaller current can create a larger voltage drop. This voltage difference along resistor 20 causes trigger node 63 to fall below power node 62, VDD. Once trigger node 63 falls more than a threshold below VDD, p-channel transistor 10 can turn on, since its gate is trigger node 63. The gate of n-channel shunt transistor 50 is driven higher, causing n-channel shunt transistor 50 to turn on. Large currents are drawn from power node 62 to ground bus 60. Temperature in p-substrate 64 will increase due to the high current. These large currents can cause voltage drops along power line 62, inducing VDD/GND line potential instabilities. Due to the large size of shunt transistor 50, a large amount of hot electron injection can occur from the high-field channel region close to the drain in n-channel shunt transistor 50 which leads to a large substrate current. It is well known that high silicon temperature, VDD/GND line potential fluctuations, and large substrate currents make latchup events more likely to occur.

A voltage drop across resistor 20 in N-well 22 can thus indirectly trigger a latchup event. Improved layout such as increased spacing and additional p+ taps to p-substrate 64 around n+ region 66 can reduce latch-up susceptibility, but additional taps and guard rings can occupy a significant area of the IC die.

What is desired is a reduction in susceptibility to latch up in an active VDD-to-VSS ESD clamp circuit. An active circuit technique to reduce latch-up susceptibility of the VDD-to-VSS clamp is desirable.

DETAILED DESCRIPTION

The present invention relates to an improvement in ESD-protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that an active circuit technique can reduce susceptibility to latch-up for the VDD-to-VSS clamp. In particular, a p-channel pull-up transistor can be added in a feedback loop to the N-well resistor. The p-channel pull-up transistor prevents a voltage drop from occurring along the N-well resistor, eliminating a possible latch-up trigger point.

Figure 1:
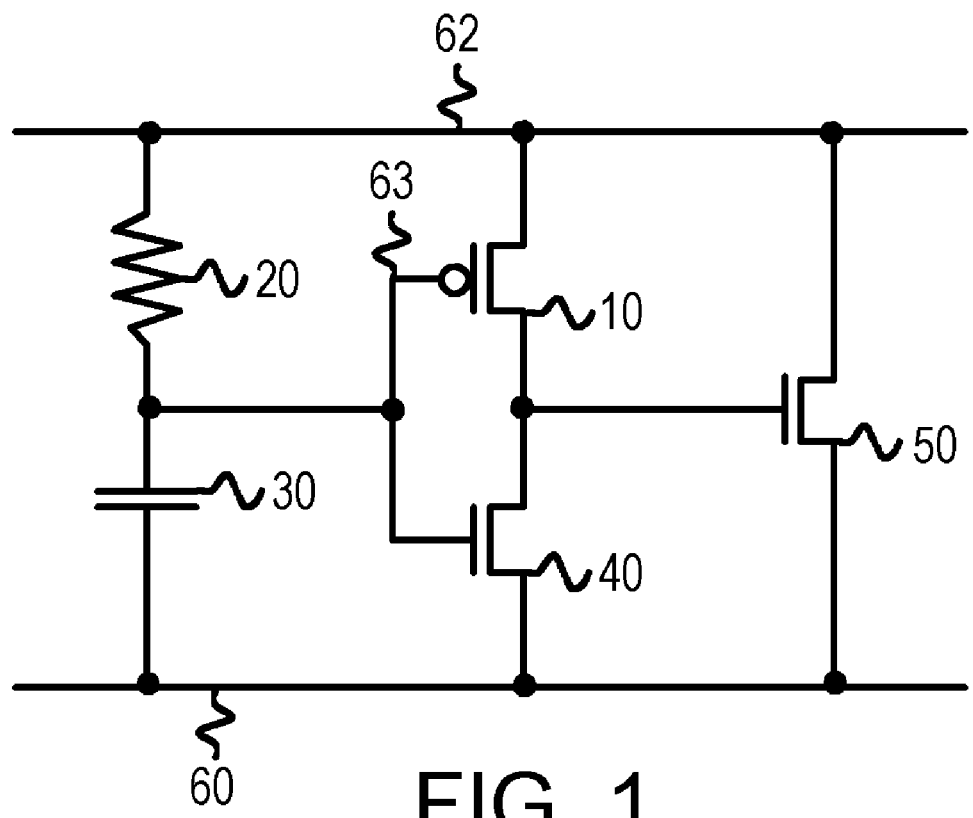
FIG. 1 shows a prior-art active ESD-protection circuit.
Figure 2:
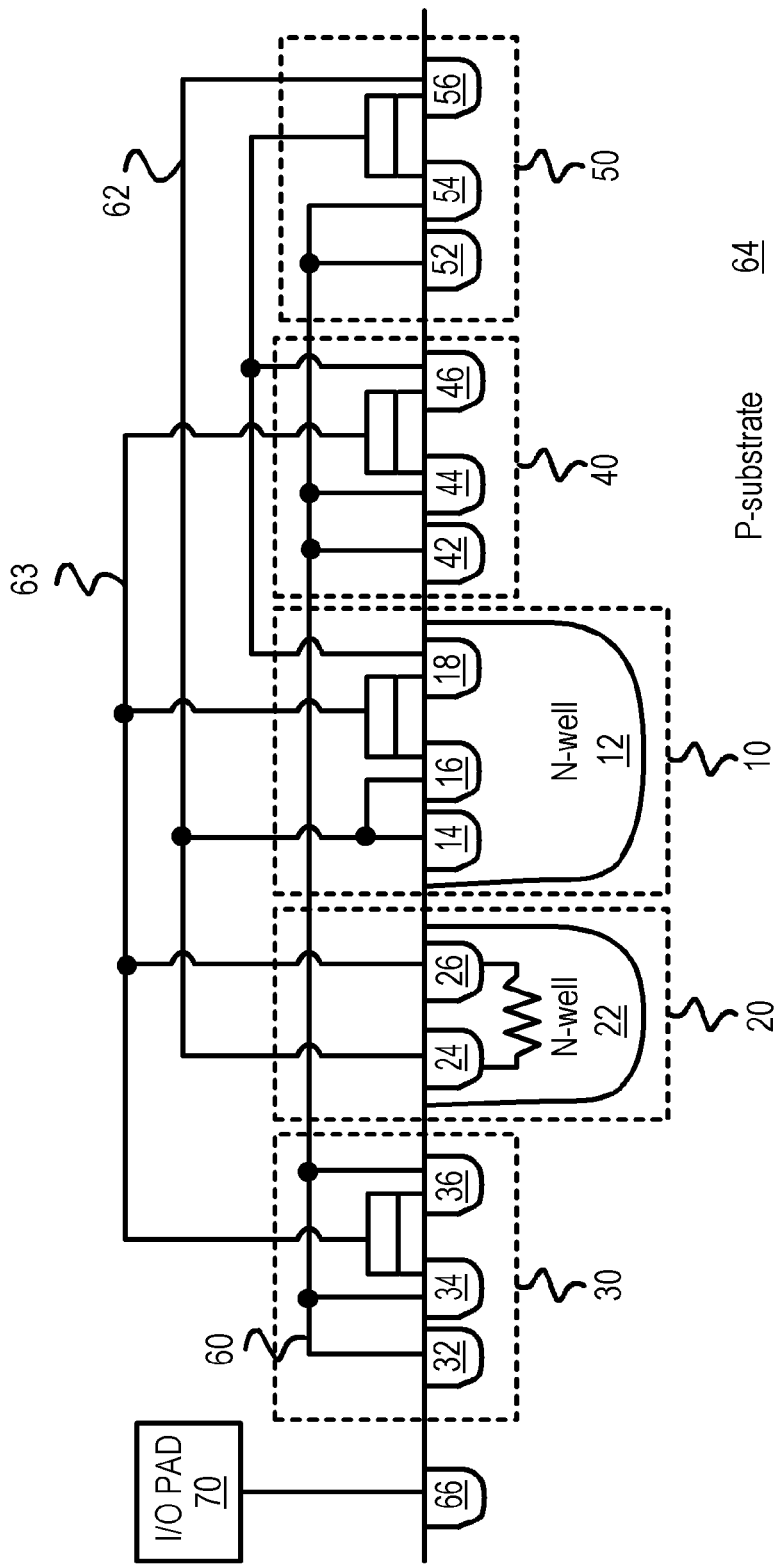
FIG. 2 is a cross-section diagram of the VDD-to-VSS clamp circuit of FIG. 1.
Figure 3:
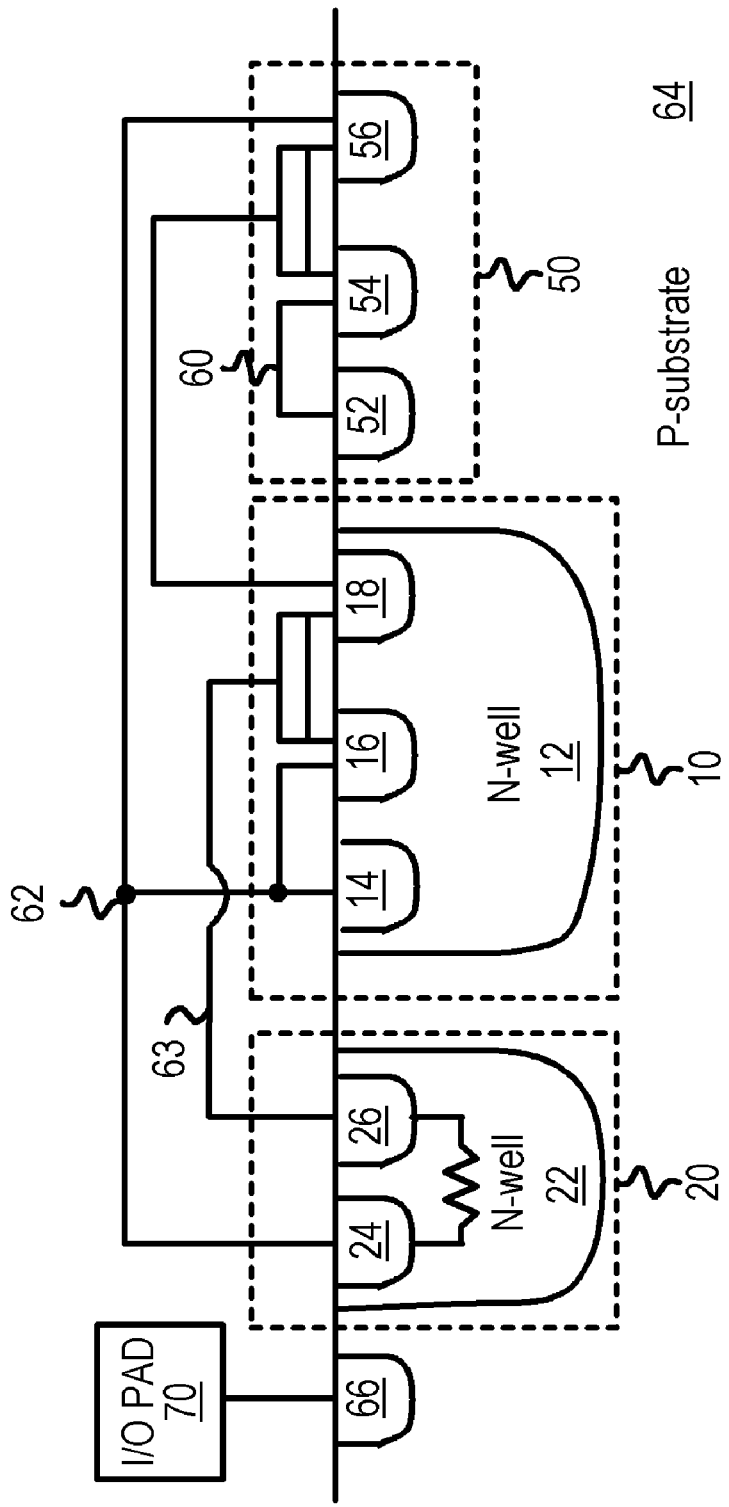
FIG. 3 highlights a potential latch-up trigger in the VDD-to-VSS clamp circuit.
Figure 4:
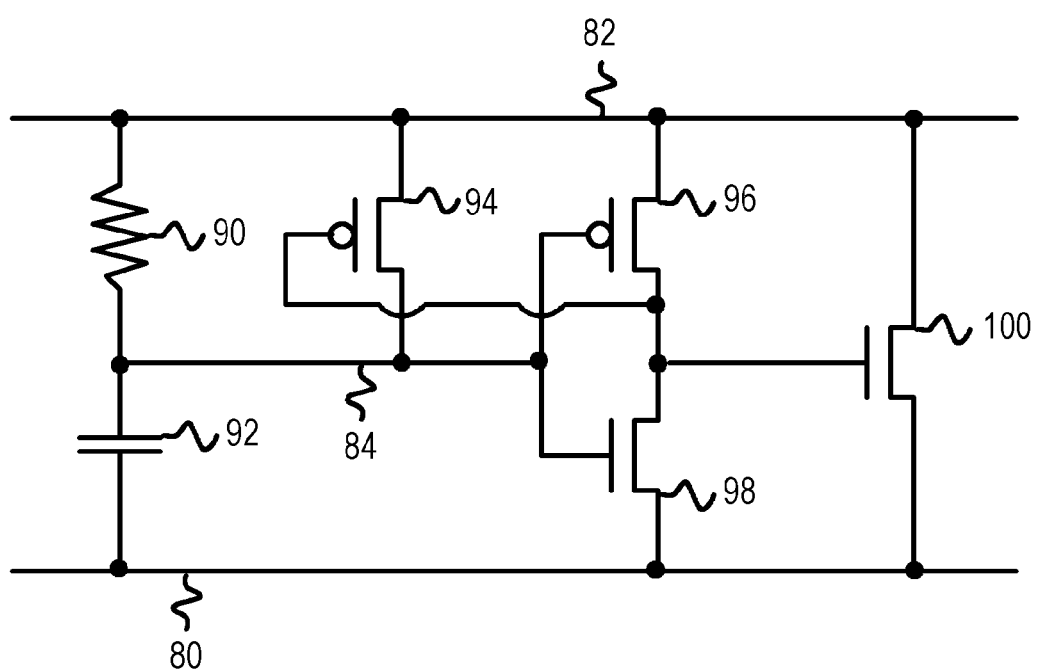
FIG. 4 shows an active ESD-protection circuit with an active latch-up protection transistor.

FIG. 4 shows an active ESD-protection circuit with an active latch-up protection transistor. Power node 82 is connected to a power supply pin such as VDD. Ground bus 80 is connected to a ground pad. During normal powered operation, the top plate of capacitor 92 is charged to VDD through resistor 90 from power node 82. The high voltage on node 84, the gates of transistors 96, 98 turns on n-channel transistor 98 and turns off p-channel transistor 96, causing the gate of n-channel shunt transistor 100 to be driven low. This keeps n-channel shunt transistor 100 turned off, allowing power node 82 to remain at VDD to power internal circuits.

When an ESD zap or pulse is applied to power node 82, or is somehow coupled into power node 82, such as through a common-discharge line (CDL), the rapid rise in voltage on node 82 causes the source of p-channel transistor 96 to rise quickly. The gate of p-channel transistor 96 does not rise as quickly because of the R-C time constant delay caused by charging of capacitor 92 through resistor 90. The gate-to-drain voltage across p-channel transistor 96 increases in absolute value, causing p-channel transistor 96 to turn on. P-channel transistor 96 then charges the gate of n-channel shunt transistor 100 by connecting it to power node 82. The high voltage applied to the gate of n-channel shunt transistor 100 turns it on so that n-channel shunt transistor 100 shunts the ESD current from power node 82 to ground bus 80.

As current slowly flows through resistor 90 to charge the top plate of capacitor 92, the voltage on the gates of transistors 96, 98 rises. Eventually p-channel transistor 96 turns off and n-channel transistor 98 turns on, discharging the gate of n-channel shunt transistor 100 and turning it off. Also, as n-channel shunt transistor 100 discharges power node 82, eventually the magnitude of the gate-to-source voltage of p-channel transistor 96 falls below threshold, turning p-channel transistor 96 off.

Feedback is provided by p-channel feedback transistor 94. The gate of p-channel feedback transistor 94 receives the drain outputs of transistors 96, 98, which is also the gate of n-channel shunt transistor 100. When the gate of transistor 100 is low, p-channel feedback transistor 94 turns on, driving trigger node 84 high, since the source of p-channel feedback transistor 94 connects to power node 82. During an ESD pulse, initially the gate of shunt transistor 100 is high, so feedback p-channel transistor 94 is off. Feedback transistor 94 has a negligible effect on the time constant that is determined by N-well resistor 90 and MOS capacitor 92.

During normal operation, p-channel feedback transistor 94 is on since n-channel shunt transistor 100 is off. Having p-channel feedback transistor 94 turned on effectively shunts resistor 90, drastically reducing the effective resistance between power node 82 and trigger node 84. Even when N-well resistor 90 is collecting an injected electron current, the voltage at trigger node 84 is still maintained at a high state, and shunt transistor 100 remains in the off state. Hence the latch-up susceptibilities mentioned earlier are nullified.

P-channel feedback transistor 94 acts as a virtual or active n+ tap to the N-well for resistor 90 when power is applied. When power is off, such as before ESD tests, this virtual tap disappears as p-channel feedback transistor 94 turns off. Thus ESD protection is still provided by the VDD-to-VSS clamp circuit.

The likelihood of accidental triggering of the VDD-to-VSS shunt and n-channel shunt transistor 100 is also reduced by p-channel feedback transistor 94. P-channel feedback transistor 94 provides a low resistance path from power node 82 to trigger node 84. Small capacitive couplings of currents into trigger node 84 are thus compensated for by p-channel feedback transistor 94, preventing accidental turn on of p-channel transistor 96 and n-channel shunt transistor 100. Without p-channel feedback transistor 94, a VDD glitch (i.e. a momentary increase in VDD potential) can cause the p-channel transistor 96 and shunt transistor 100 to turn-on and induce latch-up as mentioned previously.

During an ESD event when n-channel shunt transistor 100 turns on, p-channel feedback transistor 94 can turn on and terminate the current shunting once power node 82 falls to within a threshold of the gate node of n-channel shunt transistor 100. Thus the ESD shunt current is automatically terminated as a function of the voltage on power node 82 and the gate of n-channel shunt transistor 100.

One embodiment of the VDD-to-VSS clamp circuit has a resistor of 26.4 K-ohms, a capacitor of 19.7 pico-farads, a 1600-micron-wide shunt transistor, a 100-micron wide p-channel transistor and a 10-micron-wide n-channel transistor in the inverter stage, and a 3-micron-wide p-channel feedback transistor.

ALTERNATE EMBODIMENTS

Several other embodiments are contemplated by the inventors. Different transistor, capacitor, resistor, and other device sizes can be used, and various layout arrangements can be used, such as multi-leg, ring, doughnut or irregular-shape transistors. Additional taps, guard rings, transistors, and other components may be added. Several of the VDD-to-VSS clamps can be provided at different locations within a larger chip, or between different power supplies when multiple supplies or dedicated I/O supplies are present. The power node could be a common-discharge line (CDL) that normally floats rather than a power line.

A p-channel shunt transistor may be used rather than n-channel shunt transistor 100 when an additional inversion is provided. Additional leaker devices such as resistors and small transistors could be added. Parasitic capacitances and resistances may be used from some components, depending on the process and device sizes used.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A VDD-to-VSS claim circuit comprising:
    a power node driven by a power supply;
    a ground node for coupling to a ground supply;
    a shunt transistor that conducts current from the power node to the ground node in response to a gate node;
    a buffer that drives the gate node in response to a trigger node;
    a resistor and a capacitor in series between the power node and the ground node, with the trigger node between the resistor and the capacitor; and
    a feedback transistor having a gate driven by the gate node, for conducting current to the trigger node;
wherein the feedback transistor conducts current in parallel to the resistor,
whereby the feedback transistor prevents a large voltage difference between the power node and the trigger node when the feedback transistor is turned on and whereby the shunt transistor conducts current between the power node and the sound node to protect other circuits connected between the power node and the ground node.

2. The VDD-to-VSS clamp circuit of claim 1 wherein the feedback transistor hardens the VDD-to-VSS clamp circuit from latch-up by ensuring that the shunt transistor is in an off state under a normal powered condition when the feedback transistor is turned on.

3. The VDD-to-VSS clamp circuit of claim 2 wherein the resistor is formed in an N-well.

4. The VDD-to-VSS clamp circuit of claim 2 wherein the feedback transistor conducts current to the trigger node when the shunt transistor is turned off.

5. The VDD-to-VSS clamp circuit of claim 1 wherein the feedback transistor and the resistor are each coupled between the power node and the trigger node.

6. The VDD-to-VSS clamp circuit of claim 5 wherein the feedback transistor is a p-channel feedback transistor.

7. The VDD-to-VSS clamp circuit of claim 6 wherein the shunt transistor is an n-channel transistor.

8. The VDD-to-VSS clamp circuit of claim 7 wherein the buffer is an inverter that inverts the trigger node to generate the gate node.

9. The VDD-to-VSS clamp circuit of claim 8 wherein the buffer comprises a p-channel pull-up transistor and an n-channel pull-down transistor having drains driving the gate node and gates driven by the trigger node.

10. The VDD-to-VSS clamp circuit of claim 1 wherein the capacitor is connected between the trigger node and the ground node.

11. A protective circuit comprising:
    shunt means, connected between a first and a second supply line, for shunting current between the first and second supply line in response to a gate signal;
    buffer means for generating the gate signal in response to a trigger signal;
    time-constant means, coupled between the first and second supply lines, for initially holding the trigger signal at a first state when a discharge occurs to the first supply line, and for driving the trigger signal to a second state after a timed delay when the discharge occurs; and
    feedback means, coupled to drive the trigger signal and responsive to the gate signal, for driving the trigger signal to the second state when no discharge occurs,
whereby the feedback means drives the trigger signal to prevent accidental triggering of the protective circuit.

12. The protective circuit of claim 11 wherein the feedback means is connected to conduct current between the first supply line and the trigger signal.

13. The protective circuit of claim 11 wherein the shunt means comprises a shunt transistor between the first and second supply lines;
    wherein the buffer means comprises inverter means for inverting a state of the trigger signal to generate the gate signal;
    wherein the feedback means comprises a feedback transistor of an opposite type as a type of the shunt transistor.

14. The protective circuit of claim 13 wherein the time-constant means comprises:
    a resistor coupled between the first supply line and the trigger signal; and
    a capacitor coupled between the second supply line and the trigger signal, wherein the feedback means drives the trigger signal to the second state before the timed delay of the resistor and capacitor.

15. The protective circuit of claim 14 wherein the shunt transistor is an n-channel transistor and wherein the feedback transistor is a p-channel transistor.

16. The protective circuit of claim 15 wherein the first supply line is coupled to a power supply and the second supply line is coupled to a ground.

17. The protective circuit of claim 16 wherein the resistor is formed in an N-well that can collect electrons injected by an n+ region that pass through a p-substrate region,
    wherein the feedback means reduces a voltage drop within the N-well when the N-well collects electrons,
    whereby latch-up susceptibility of the resistor is reduced by the feedback means.

* * * * *